US006657313B1

(12) United States Patent
Brofman et al.

(10) Patent No.: US 6,657,313 B1
(45) Date of Patent: Dec. 2, 2003

(54) DIELECTRIC INTERPOSER FOR CHIP TO SUBSTRATE SOLDERING

(75) Inventors: Peter J. Brofman, Hopewell Junction, NY (US); Shaji Faroon, Hopewell Junction, NY (US); John U. Knickerbocker, Hopewell Junction, NY (US); Scott I. Langenthal, Hyde Park, NY (US); Sudipta K. Ray, Wappingers Falls, NY (US); Kathleen A. Stalter, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/233,385

(22) Filed: Jan. 19, 1999

(51) Int. Cl.[7] .............................................. H01L 23/48
(52) U.S. Cl. ....................... 257/781; 257/780; 257/734; 257/773; 257/779; 438/612; 438/614
(58) Field of Search .......................... 29/830, 832, 840, 29/834, 836, 841; 438/118, 124, 125, 126, 127, 612, 614; 257/668, 672, 698, 712, 146, 747, 773, 779, 780, 781, 678, 734

(56) References Cited

U.S. PATENT DOCUMENTS

| 3,657,610 A | | 4/1972 | Yamamoto et al. |
| 4,693,770 A | | 9/1987 | Hatada |
| 5,111,279 A | * | 5/1992 | Pasch et al. .................. 357/81 |
| 5,569,963 A | | 10/1996 | Rostoker et al. |
| 5,729,896 A | * | 3/1998 | Dalal et al. .................... 29/840 |
| 5,834,339 A | * | 11/1998 | Distefano et al. ........... 438/125 |
| 6,087,597 A | * | 7/2000 | Shimada et al. ........ 257/780 X |

OTHER PUBLICATIONS

Takagi et al, "Volumetric Description of Dip Solder Joints from Range Data", IEEE Workshop on Applications of Computer Vision, 1998, WACV'98, Fourth Proceedings, Oct. 1998, pp. 146–151.*

* cited by examiner

Primary Examiner—A. Dexter Tugbang
(74) Attorney, Agent, or Firm—DeLio & Peterson, LLC; Kelly M. Reynolds; Ira D. Blecker

(57) ABSTRACT

A device for preventing short circuits between solder joints in flip chip packaging. The dielectric interposer has a plurality of apertures or vias which correspond to the I/O pads on a chip and substrate. Preferably, the interposer comprises a polyester film, glass, alumina, polyimide, a heat curable polymer or an inorganic powder filler in an organic material. More preferably, the interposer contains an adhesive or has adhesive layers disposed on the linear surfaces of the interposer. Cone shaped solder elements are formed within the apertures of the interposer. The dielectric interposer is positioned between a chip and substrate in an electronic module and thermally reflowed to create an electrical and mechanical interconnection. The interposer prohibits contact between the solder joints by isolating each of the joints and corresponding bonding pads. The interposer also prevents over compression of the solder joints by acting as a stand off.

12 Claims, 3 Drawing Sheets

DIELECTRIC INTERPOSER FOR CHIP TO SUBSTRATE SOLDERING

CROSS-REFERENCE TO RELATED APPLICATIONS

Aspects of the present invention are related to subject matter disclosed in U.S. Pat. No. 6,184,062 entitled "Process for Forming Cone Shaped Solder for Chip Interconnection," and U.S. Pat. No. 6,258,627 entitled "Underfill Preform Interposer for Joining Chip to Substrate," filed on even date herewith and assigned to the assignee of the present invention.

BACKGROUND OF THE INVENTION

1. Field of the Invention

This invention relates to the manufacture of semiconductor devices, and in particular, to a method of and device for preventing short circuits between solder joints in flip chip packaging.

2. Description of Related Art

Multi-layer ceramic electronic components are typically joined together by soldering pads on a surface of one of the electronic components to corresponding pads on the surface of the other component. Controlled Collapse Chip Connection is an interconnect technology developed by IBM as an alternative to wire bonding. This technology is generally known as C4 technology or flip chip packaging. Broadly stated, one or more integrated circuit chips are mounted above a single or multi-layer ceramic substrate and pads on the chip are electrically and mechanically connected to corresponding pads on the substrate by a plurality of electrical connections such as solder bumps. The integrated circuit chips may be assembled in an array such as a 10×10 array on the multi-layer ceramic surface.

Often in flip chip packaging, a semiconductor chip is joined to a substrate by means of solder joints where an array of connections from the chip are connected to a corresponding array of connections on the substrate using solder such as a lead/tin alloy. The solder is deposited on bonding pads located on the surface of the chip and substrate by means of evaporation or plating and then reflowed to cause the solder to wet the I/O pad. The chip is placed on the substrate and fluxed to ensure good wetting between the I/O pads and the solder. The chip and substrate are then subjected to a higher temperature causing the solder to melt and wet each I/O pad on the package. The assembly is cooled causing the solder to solidify, thereby providing one or more electrical connections between the chip and the substrate forming an electronic package.

Subsequently, the assembly can be cleaned to receive a nonconductive underfill to reduce the fatigue of the solder joints between the chip and the substrate. In underfiliing the electronic package to provide additional stability of the solder joints, a polymer with ceramic or glass filler is allowed to flow under the chip, between the solder connections, and later heated at an elevated temperature causing the polymer or filled polymer to cure. In this structure and method, added cost in production is incurred due to the sequential operations of solder depositions, reflow, join, underfill, and polymer cure.

The prior art methods of flip chip assembly do not prevent the solder joints from being over compressed when the chip and substrate are joined. Deformity of the solder joint can lead to short circuits when one solder joint is in contact with an adjacent solder joint. Underfilling will not prevent the shorting since the solder-to-solder contact has already been made. Thus, it is desirable to have a means of preventing short circuits between adjacent solder joints which would result in increased yield and reliability of the resulting electronic module.

Bearing in mind the problems and deficiencies of the prior art, it is therefore an object of the present invention to provide a method of preventing short circuits between solder joints in an electronic module.

It is another object of the present invention to provide an apparatus and method of fabricating the apparatus for preventing short circuits between solder joints in an electronic module.

A further object of the invention is to provide a method of assembling an electronic module having enhanced yield and reliability.

It is yet another object of the present invention to provide an electronic module having enhanced reliability.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of fabricating an interposer for electronic packaging comprising the steps of (a) providing a dielectric sheet; (b) forming a plurality of apertures traversing a thickness of the sheet; and (c) forming cone shaped solder elements within the apertures.

In step (a), the dielectric sheet is preferably a polyester film such as Kapton™ or Mylar™, polyimide, an inorganic powder filler in an organic polymer, a dielectric sheet containing an adhesive, a heat curable polymer or an inorganic material such as glass ($SiO_2$) or alumina ($Al_2O_3$).

In step (b) the plurality of apertures are preferably formed by photolithography, mechanical punching, precision drilling, or laser ablation.

In step (c) the cone shaped solder elements are formed by injection molding, or by placing solder balls into the apertures and coining the solder balls with a die having cone shaped cavities.

The method may further include the step of coating the solder elements with tin or coating the solder elements with a second solder having a lower melting temperature than the solder elements. Additionally, the step of attaching an adhesive layer to a linear surface of the dielectric sheet may be included as well.

The present invention is directed to, in a second aspect, an interposer for chip to substrate joining comprising a dielectric sheet having a plurality of vias, the vias traversing a thickness of the sheet; and conical solder elements deposited within the vias of the sheet.

The dielectric sheet preferably comprises an organic polymer, polyimide, a polyester film such as Kapton™ or Mylar™, an inorganic powder filler in an organic polymer, a dielectric sheet containing an adhesive, a heat curable polymer or an inorganic material such as glass ($SiO_2$) or alumina ($Al_2O_3$).

The vias in the dielectric sheet are preferably formed by photolithography, mechanical punching, precision drilling, or laser ablation.

The cone shaped solder elements are preferably injection molded or coined solder balls deposited in the vias coined with a die having cone shaped cavities. The solder elements may be coated with tin or coated with a second solder having a lower melting temperature than the solder elements.

The interposer may further include an adhesive sheet having corresponding apertures to the vias disposed on a linear surface of the dielectric sheet.

The present invention is directed to, in still yet another aspect, a method of assembling electronic modules comprising the steps of: (a) providing a semiconductor chip; (b) providing a substrate for mounting the chip; (c) providing an interposer comprising a dielectric sheet having a plurality of apertures, the apertures traversing a thickness of the sheet; and conical solder elements deposited within the apertures of the sheet; (d) aligning the interposer between the chip and the substrate; and (e) thermally reflowing the solder elements creating an electrical connection between the chip and the substrate.

In step (c) the dielectric sheet comprises an organic polymer, polyimide, a polyester film such as Kapton™ or Mylar™, an inorganic powder filler in an organic polymer, a heat curable polymer, or an inorganic material such as glass ($SiO_2$) or alumina ($Al_2O_3$)

Wherein in step (c) the dielectric sheet comprises a heat curable polymer, step (e) produces an underfilled electronic module. In step (d) the solder elements are aligned to corresponding bonding pads on surfaces of the chip and the substrate.

The method may further include forming an adhesive layer on a surface of the interposer, and prior to step (d), the step of coating the conical solder elements with a lower melting solder than the solder elements or with tin.

The present invention is directed to, in still yet another aspect, a flip chip electronic module comprising a semiconductor chip; a substrate for mounting the chip; and a dielectric interposer disposed between the chip and substrate having a plurality of apertures, the apertures traversing a thickness of the interposer, and conical solder elements deposited within the apertures, wherein the module is thermally reflowed such that the chip and the substrate are electrically and mechanically interconnected by the solder elements and the solder elements are not in contact with an adjacent solder element.

The solder elements of the module may be coated with tin or a lower melting temperature solder than the solder elements.

The dielectric interposer may comprise of an organic polymer, polyimide, a polyester film such as Kapton™ or Mylar™, an inorganic powder filler in an organic polymer, a polymer with an adhesive, a heat curable polymer, or an inorganic material such as glass ($SiO_2$) or alumina ($Al_2O_3$). The interposer may further include adhesive layers disposed on the linear surfaces of the interposer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
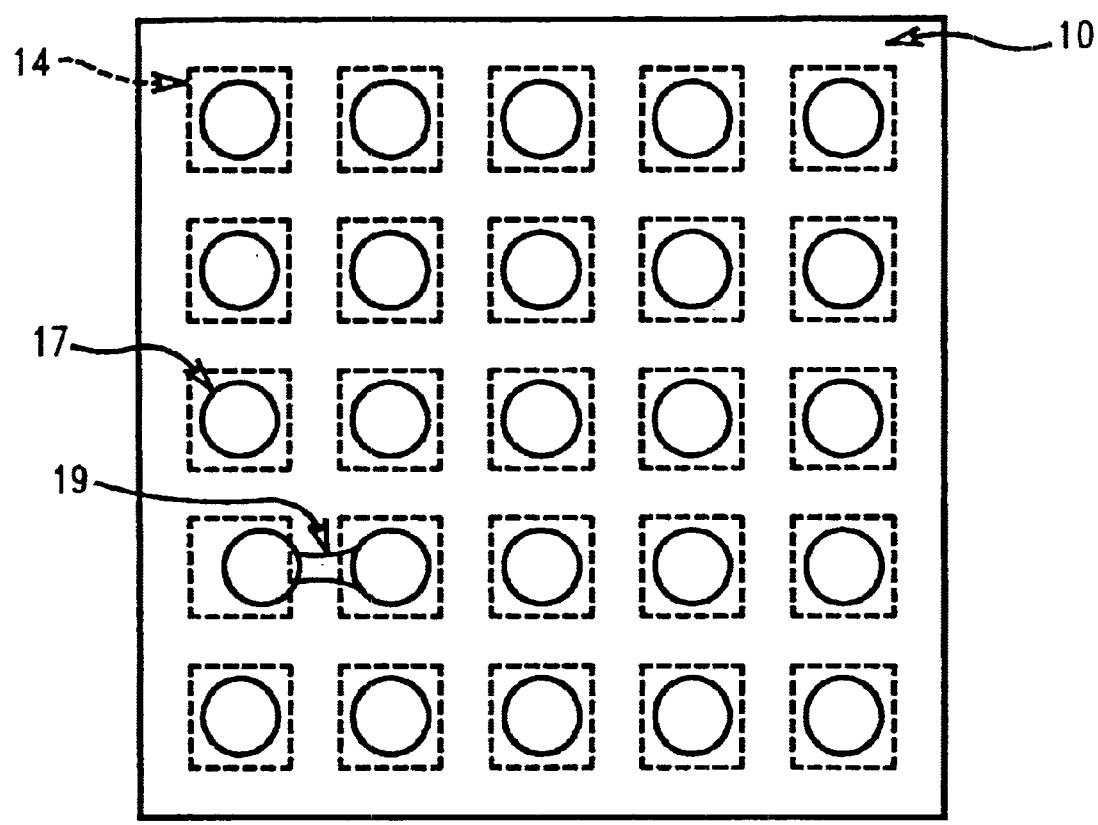
FIG. 1 is a top plan view of a substrate of the prior art.

In describing the preferred embodiment of the present invention, reference will be made herein to FIGS. 1–6 of the drawings in which like numerals refer to like features of the invention. Features of the invention are not necessarily shown to scale in the drawings.

Figure 2:
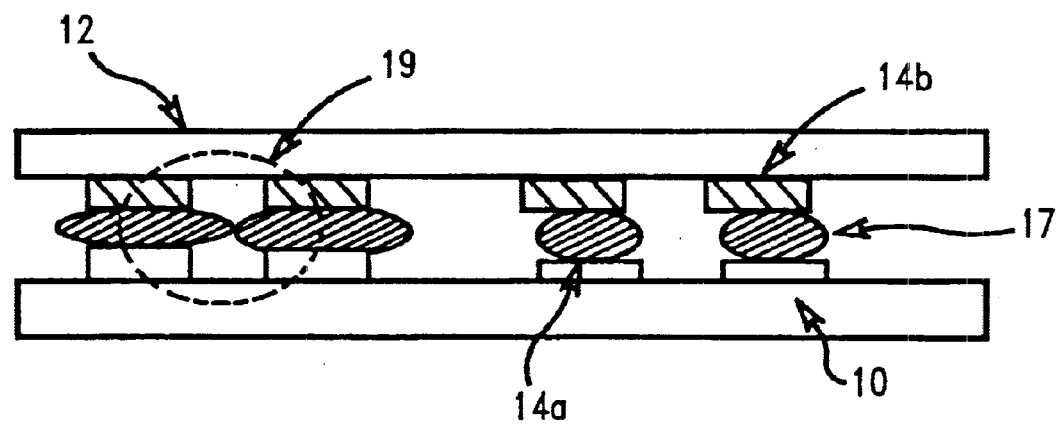
FIG. 2 is an elevational cross-sectional view of an electronic module of the prior art.

In FIG. 1 there is shown a top plan view of a substrate 10 of the prior art used in flip chip packaging. On the surface of the substrate 10 are bonding pads 14 which correspond to the I/O pads on the substrate to be electrically and mechanically connected to corresponding I/O pads on a chip. Solder balls 17 are formed on substrate 10 as the interconnections. Normally, the solder balls 17 flow within the boundaries specified by the bonding pads 14, however, solder balls and bonding pads are often aligned such that shorts 19 occur as shown in FIGS. 1 and 2. FIG. 2 is a partial cross-sectional view of an electronic module having substrate 10 with bonding pads 14a, connected to chip 12 having corresponding bonding pads 14b by solder bumps 17. If chip 12 is placed on substrate 10 during formation of the flip chip package with excessive force, there can be an over compression of the solder bumps 17. This over compression can lead to shorts in area 19 wherein the solder bumps 17 are misshapen to such a degree that two solder bumps can come in contact with each other.

Figure 3:
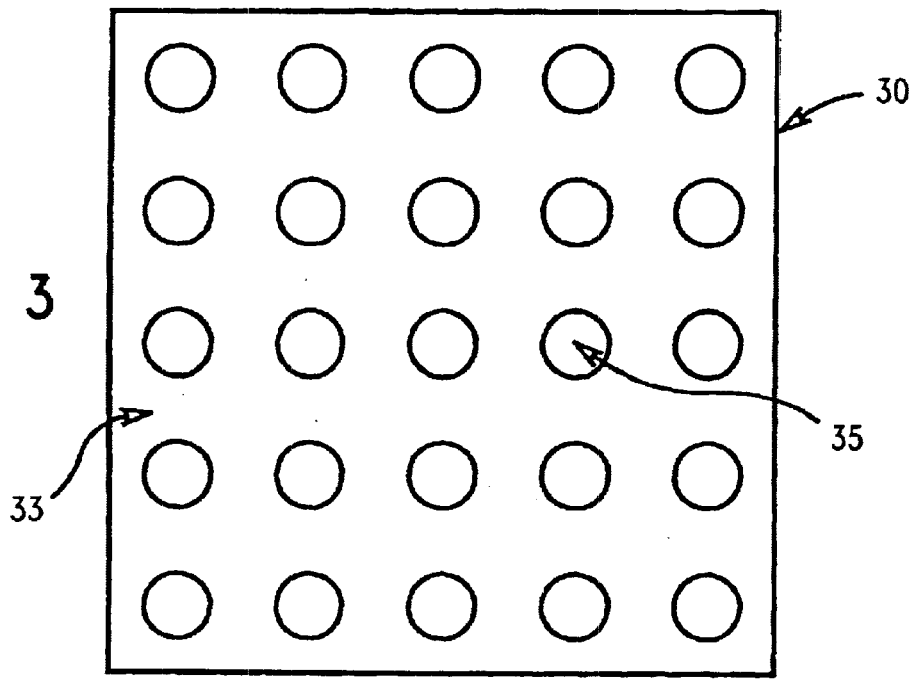
FIG. 3 is a top plan view of an interposer of the present invention.

FIG. 3 shows a free-standing polymer interposer 30 of the present invention. Preferably, the interposer 30 is made from a dielectric material 33. Examples include polyester films such as Kapton™ or Mylar™, organic polymers such as polyimide, an inorganic powder filler in an organic polymer, ceramic, inorganic materials such as glass ($SiO_2$) or alumina ($Al_2O_3$), or any other appropriate material which is non-conductive and which may or may not be heat curable. The interposer 30 has a plurality of apertures or vias 35 which correspond to the I/O pads on a chip 42 and substrate 40 in the resultant electronic package shown in FIGS. 4 and 5. For the ease of differentiation in the drawings, the apertures 35 are shown as circles and bonding pads 44 are shown as squares although any shape may be utilized on practicing the invention.

Figure 4:
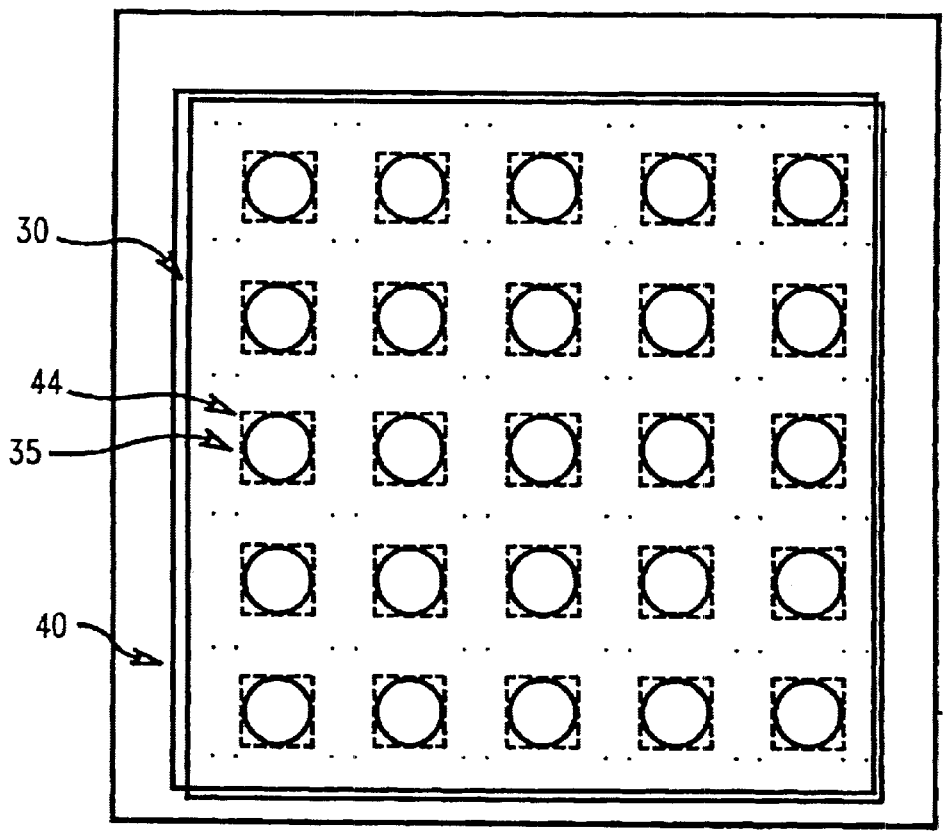
FIG. 4 is a top plan view of an interposer of the present invention aligned with a substrate.

FIG. 4 is a top plan view of the electronic package utilizing the interposer 30 of the present invention. Interposer 30 can be made by obtaining a dielectric sheet correctly sized for the resultant electronic module. Apertures or vias are formed in the dielectric sheet by such means as mechanical punching, precision drilling, laser ablation, or any other means which allow apertures of very small dimensions to be formed.

Solder can be screen printed into the apertures of the interposer or solder balls can be injection molded or placed into the apertures. Solder balls placed into the apertures of the dielectric sheet must then be mechanically pressed or thermally processed such that the solder balls will remain in the interposer. The solder of the solder paste may contain flux in the paste or have the flux deposited on the surface of the paste for the purpose of improving the wettability between the solder and each I/O pad to be electrically connected. The flux can be of the variety which leaves minimal residue so that no cleaning is required subsequent to joining the chip and the substrate. However, the use of flux which requires cleaning after joining is not required when practicing this invention.

Figure 5:
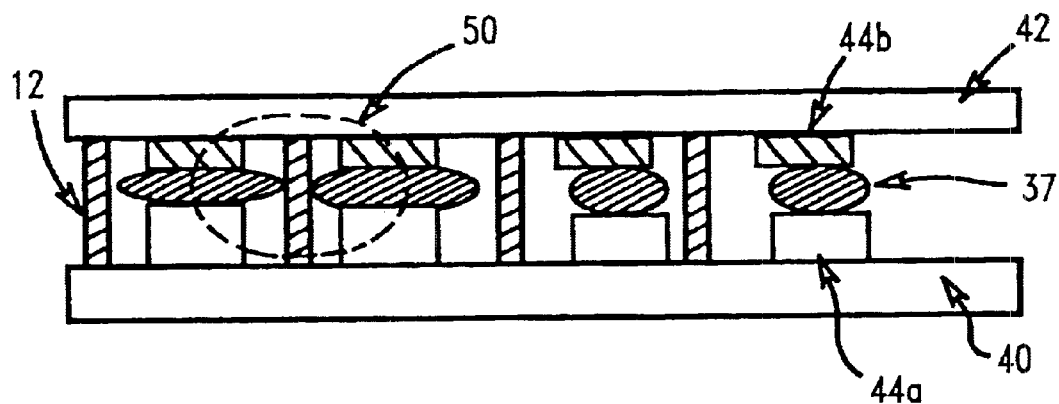
FIG. 5 is an elevational cross-sectional view of an electronic module utilizing the interposer of the present invention.
Figure 6:
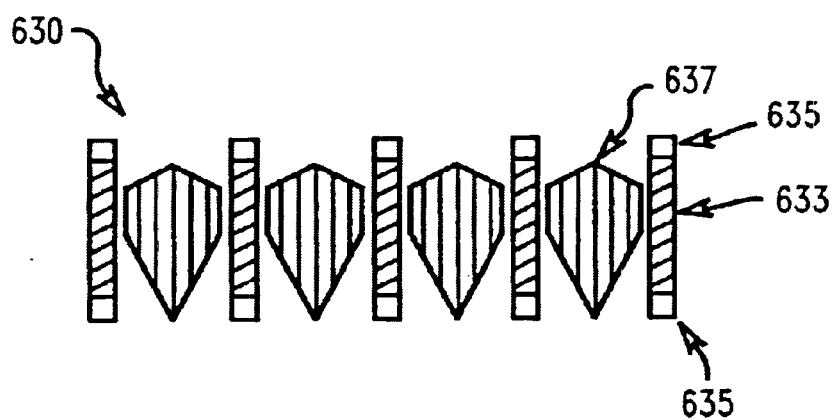
FIG. 6 is an elevational cross-sectional view of a preferred embodiment of the interposer of the present invention.

Once the interposer has been fabricated and solder joints formed or placed into the apertures, the interposer is placed between the chip and the substrate as shown in FIGS. 4–6. The assembly can be thermally reflowed to create an electrical interconnection between the chip and substrate. Preferably, the interposer may comprise a glass or ceramic filled dielectric sheet having adhesive layers on its surface such that not only is an electrical interconnection formed, but a mechanical enhancement is also produced.

An electronic module utilizing the interposer 30 of the present invention having substrate 40 and chip 42 both having corresponding bonding pads 44a and 44b, is shown with more detail in FIG. 5. Area 50 between two adjacent solder joints 37 are no longer in contact to short out the electronic module. The interposer 30 successfully prohibits contact between solder joints 37 by isolating each of the solder joints and corresponding bonding pads. The interposer 30 also prevents over compression of the solder joints 37 by acting as a stand off between the substrate 40 and chip 42. In another preferred embodiment, the interposer may comprise a heat curable polymer which also acts as an underfill such that only one thermal activation step is required to reflow the solder and join the components of the electronic package.

In a preferred embodiment, the interposer 630 of FIG. 6 comprises a dielectric sheet 633 having a plurality of apertures. The dielectric sheet 633 further comprises adhesive layers 635 on its surface which facilitate joining between the interposer and the chip, and the interposer and the substrate. Of course, the dielectric sheet of the interposer may also be a polymer with an adhesion promoter contained therein such that the polymer sheet itself has enhanced adhesive characteristics and could also flow around the solder joints. Such a dielectric interposer could be heated during or after formation of the solder joints to electrically connect the chip to the substrate. Alternatively, such a dielectric interposer with adhesive can enhance the mechanical integrity and reliability of the interconnection of the electronic module. The adhesive may also be deposited after interposer fabrication but prior to creating the chip to substrate interconnection.

The preferred embodiment of an interposer of the present invention contains cone shaped solder 637 disposed within the apertures of the polymer sheet 633. The cone shape solder 637 permits a reduced force for a given I/O pad to allow for some non-planarity between the chip, the interposer, and the substrate. The solder could be shaped with a coining die made from graphite, glass, molybdenum, titanium or an alloy thereof, nickel alloy, or stainless steel. Other methods of shaping the solder include thermal injection and a cooling/solidification process.

The solder composition used in the interposer of the present invention may also comprise of more than one solder composition. For example, a high melt solder composition such as a 95–97% lead/tin alloy could be used with a lower melting solder such as a eutectic lead/tin alloy. In this case, the combination of high melt and low melt solder would provide a means to create an interconnection at a moderate joining temperature. Alternatively, the solder joints may also be coated with tin or the lower melting solder during formation of the interposer prior to placing the interposer between a chip and substrate.

The present invention achieves the objects recited above. The present invention successfully reduces short circuiting between solder joints in an electronic module by isolating the solder joints. Placing the interposer between the chip and the substrate in an electronic module also acts as a stand off reducing solder to solder electrical shorts and can provide improved mechanical integrity for chip to substrate or chip to board interconnections. Thus, resulting electronic modules utilizing an interposer of the present invention has enhanced reliability and integrity.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A flip chip electronic module intermediate product comprising:

a semiconductor chip;

a substrate for mounting said chip; and a dielectric interposer disposed between said chip and said substrate having a plurality of apertures, said apertures traversing a thickness of said interposer; and conical solder elements deposited within said apertures, whereby said interposer separates said solder elements so that said solder elements are not in contact with an adjacent solder element.

2. The module of claim 1 wherein said solder elements are coated with tin.

3. The module of claim 1 wherein said solder elements are coated with a lower melting temperature solder than said solder elements.

4. The module of claim 1 wherein said dielectric interposer comprises a polyester film.

5. The module of claim 1 wherein said dielectric interposer comprises glass.

6. The module of claim 1 wherein said dielectric interposer comprises alumina.

7. The module of claim 1 wherein said dielectric interposer comprises polyimide.

8. The module of claim 1 wherein said dielectric interposer comprises an inorganic powder filler in an organic polymer.

9. The module of claim 1 wherein said dielectric interposer comprises a heat curable polymer.

10. The module of claim 1 wherein said dielectric interposer comprises a polymer containing an adhesive.

11. The module of claim 1 wherein said interposer further includes adhesive layers disposed on linear surfaces of said interposer.

12. A flip chip electronic module intermediate product comprising:

a semiconductor chip;

a substrate for mounting said chip;

a dielectric interposer disposed between said chip and substrate having a plurality of apertures, said apertures traversing a thickness of said interposer; and, conical solder elements comprising a combination of a high melt solder and a low melt solder deposited within said apertures, whereby said solder elements are not in contact with an adjacent solder element.

* * * * *